(12) United States Patent
Ting

(10) Patent No.: US 6,214,705 B1
(45) Date of Patent: Apr. 10, 2001

(54) METHOD FOR FABRICATING A GATE ELETRODE

(75) Inventor: Weichi Ting, Kaohsiung (TW)

(73) Assignee: United Microelectronics Corp., Hsinchu (TW)

(*) Notice: Subject to any disclaimer, the term of this patent is extended or adjusted under 35 U.S.C. 154(b) by 0 days.

(21) Appl. No.: 09/237,595

(22) Filed: Jan. 25, 1999

(30) Foreign Application Priority Data

Dec. 15, 1998 (TW) .................................................. 87120800

(51) Int. Cl.⁷ ................................................. H01L 21/4763
(52) U.S. Cl. .......................... 438/482; 438/592; 257/411
(58) Field of Search ................................ 438/482, 592; 257/411

(56) References Cited

U.S. PATENT DOCUMENTS

| 4,666,816 | * | 5/1987 | Kojima | 430/128 |
| 4,679,062 | * | 7/1987 | Okamoto | 350/334 |
| 5,663,085 | * | 9/1997 | Tanigawa | 438/255 |
| 5,885,889 | * | 3/1999 | Aisou | 438/592 |

* cited by examiner

*Primary Examiner*—Charles Bowers
*Assistant Examiner*—David S Blum
(74) *Attorney, Agent, or Firm*—Jiawei Huang; J.C. Patents

(57) ABSTRACT

A manufacturing method of a gate electrode is described. A plurality of undoped amorphous silicon layers and a plurality of doped amorphous silicon layers are alternately formed on a substrate.

10 Claims, 2 Drawing Sheets

METHOD FOR FABRICATING A GATE ELETRODE

CROSS-REFERENCE TO RELATED APPLICATION

This application claims the priority benefit of Taiwan application serial no. 87120800, filed Dec. 15, 1998, the full disclosure of which is incorporated herein by reference.

BACKGROUND OF THE INVENTION

1. Field of the Invention

This invention relates to a method for fabricating a metal oxide semiconductor field effect transistor (MOSFET), and more particularly, to a manufacturing method of multi-layered gate electrode on a MOSFET.

2. Description of Related Art

As semiconductor devices are highly integrated, the gate electrode of a MOSFET becomes narrower. If the gate electrode is decreased in width, its electric resistance is increased, thereby lowering the operating speed of the semiconductor device.

A phosphorus-doped polysilicon layer is formed as a gate electrode with an aim of reducing the resistance of the gate electrode. The phosphorous atoms in the polysilicon layer are doped to lower the resistance of the gate electrode. The phosphorus-doped polysilicon layer is formed in a process comprising an annealing step for uniformly distributing the phosphorus atoms in it. For achieving the distribution, the annealing step should be performed at a high temperature. However, in this high temperature annealing, the phosphorus atoms often accumulate in a great numbers near the interface between the polysilicon layer and the gate dielectric located beneath the polysilicon layer. Since the thickness of the gate dielectric is desirably reduced, some of the accumulated phosphorus atoms can penetrate through the gate dielectric layer to the channel region beneath the gate dielectric, thereby undesirably lowering the gate breakdown voltage.

A phosphorus-doped amorphous silicon layer is proposed for use in gate formation to reduce the accumulation phenomenon of the phosphorus atoms. However, the phosphorus atoms do not distribute uniformly to satisfy requirements, and thereby cause an undesirable raise in the gate resistance.

SUMMARY OF THE INVENTION

In one aspect, the present invention provides a manufacturing method for a gate electrode on a MOSFET to reduce the accumulation phenomenon encountered in the prior art.

In another aspect, the present invention provides a manufacturing method for a gate electrode that lowers the gate resistance.

In accordance with the present invention, the manufacturing method of a gate electrode comprises the steps of forming an undoped amorphous silicon layer on a substrate and forming a doped amorphous silicon layer on the undoped amorphous silicon layer.

In accordance with one particular embodiment of the present invention, the method for manufacturing a gate electrode comprises the steps of alternately forming a plurality of undoped amorphous silicon layers and a plurality of doped amorphous silicon layers on a gate dielectric, and annealing the doped and the undoped amorphous silicon layers.

The amorphous silicon layers formed in an alternating manner of the gate electrode manufacturing by the present method can unify their impurity distribution, thereby lowering the resistance of the gate electrode. Furthermore, the interfaces between the formed amorphous silicon layers with different doping status limit the diffusion paths of the impurities, thereby reducing their chances to accumulate near the gate dielectric during the annealing step.

It is to be understood that both the foregoing general description and the following detailed description are exemplary and explanatory only and are not restrictive of the invention, as claimed.

BRIEF DESCRIPTION OF DRAWINGS

The invention can be more fully understood by reading the following detailed description of the preferred embodiments, with reference made to the accompanying drawings, wherein.

DETAILED DESCRIPTION OF PREFERRED EMBODIMENTS

Figure 1A:
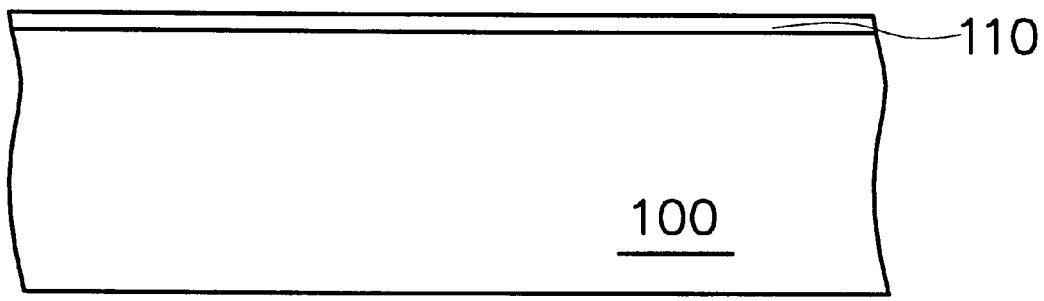
FIGS. 1A–1D are schematic, cross-sectional views of a semiconductor device schematically illustrating steps taken in a preferred embodiment of the fabrication process for forming a gate electrode in accordance with the present invention.

As shown in FIG. 1A, a thin gate dielectric 110 is formed on a substrate 100. The gate dielectric 110 is formed of, for example, a thin oxide layer with a thickness of about 70 to 150 angstroms. The substrate 100 is, for example, a P-type silicon substrate.

Figure 1B:
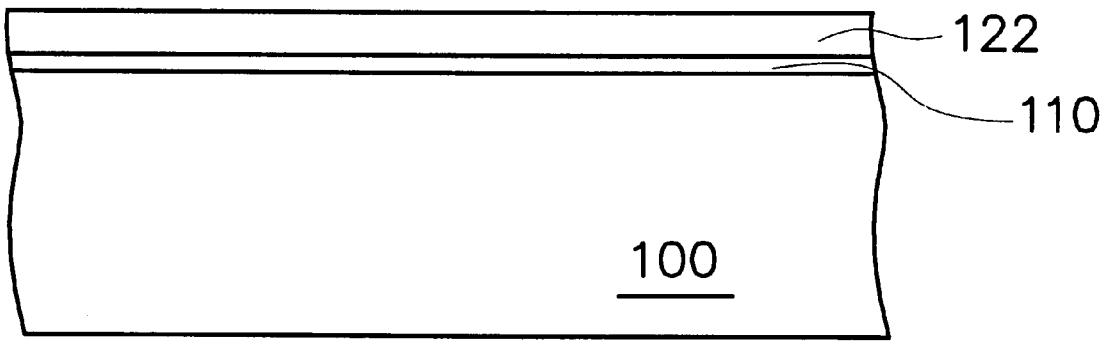

Referring to FIG. 1B, a first amorphous silicon layer 122 is formed over the gate dielectric 110. This is carried out using $Si_2H_6$ gas at approximately 500° to 600° C. It is preferred that the first amorphous silicon layer 122 is approximately 100 to 300 angstroms thick.

It is appreciated that because the first amorphous silicon layer 122 on and adjacent to the gate dielectric 110 is an undoped silicon layer, the impurity accumulation phenomenon is improved since there is not any impurity near the gate dielectric 110 before performing an annealing step.

Figure 1C:
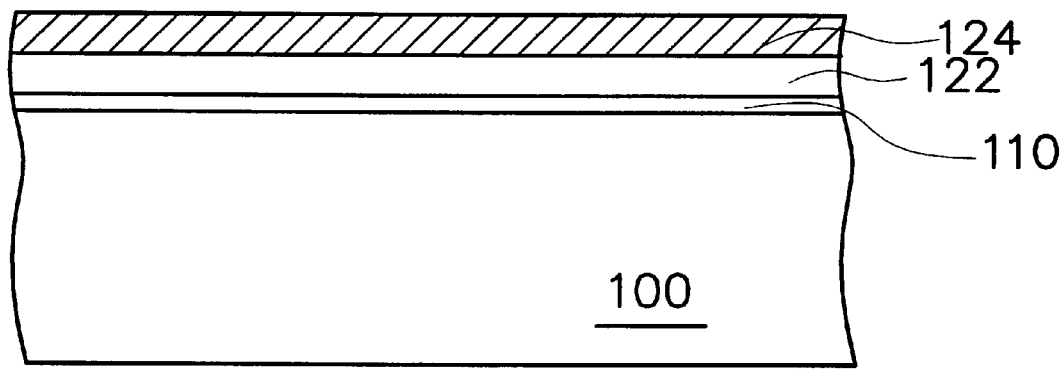

Referring to FIG. 1C, a second amorphous silicon layer 124 doped with impurities is formed on the first amorphous silicon layer 122. This is carried out using $Si_2H_6$ gas at approximately 500° to 600° C. The second amorphous silicon layer 124 with a thickness of about 100 to 300 angstroms is formed by, for example, chemical vapor deposition (CVD). During the CVD process, a dopant such as phosphorus is in-situ doped into the second amorphous silicon layer 124 so as to increase its conductivity. The dopant concentration is about $1 \times 10^{19}$ to $1 \times 10^{22}$ atom/$cm^3$.

Figure 1D:
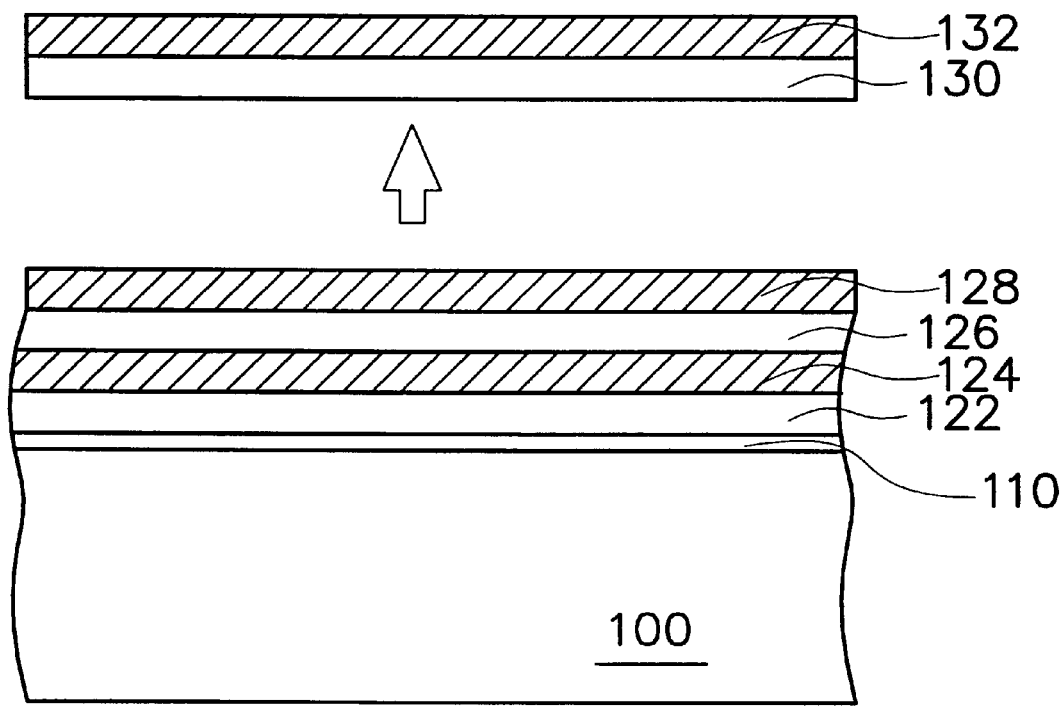

Similar to the first and second amorphous silicon layers 122, 124, amorphous silicon layers and doped amorphous silicon layers are alternatively formed in sequence over the gate dielectric 110. As shown in FIG. 1D, a third, fourth, ... (2n−1)th and 2nth amorphous silicon layers 126, 128, ... 130 and 132 are sequentially formed over the gate dielectric 110. This sequential formation is carried out by, for example, using $Si_2H_6$ gas at approximately 500° to 600° C.

In addition to the second amorphous silicon layers 124, the doped amorphous silicon layers are formed by, for example, chemical vapor deposition (CVD) and a dopant such as phosphorus is simultaneously in-situ doped thereinto. The dopant concentration is about $1 \times 10^{19}$ to $1 \times 10^{22}$ atom/$cm^3$. By doping only even-numbered layers in a plurality of amorphous silicon layers, such as the layers 124, 128, . . . 132 in this embodiment, an impurity distribution more uniform than that of a single doped amorphous silicon layer is achieved after performing an annealing step. The uniform distribution is helpful to lower the resistance of the gate electrode.

The first to 2nth amorphous silicon layers are annealed to be polysiliconized. The annealing step also allows the impurities within the doped amorphous silicon layers to diffuse into the amorphous silicon layers.

A plurality of amorphous silicon layers are formed in sequence. The interfaces between the formed amorphous silicon layers with different doping status limit the diffusion paths of the impurities, thereby reducing their chances to accumulate nearby the gate dielectric during the annealing step.

It is appreciated by one skilled in the art that the number of the alternative layers of amorphous silicon layers and doped amorphous silicon layers can be modified as desired.

The invention has been described using exemplary preferred embodiments. However, it is to be understood that the scope of the invention is not limited to the disclosed embodiments. On the contrary, it is intended to cover various modifications and similar arrangements. For example, the amorphous silicon layers provided in the present invention are also applicable in a lower electrode fabrication. The scope of the claims, therefore, should be accorded the broadest interpretation so as to encompass all such modifications and similar arrangements.

What is claimed is:

1. A manufacturing method of forming a gate electrode on a semiconductor substrate, which comprises:

forming a plurality of undoped amorphous silicon layers and a plurality of doped amorphous silicon layers on a gate dielectric, wherein the plurality of undoped amorphous silicon layers alternate with the plurality of doped amorphous silicon layers.

2. The method of claim 1, wherein each of the doped and the undoped amorphous silicon layers has a thickness of about 100 to 300 angstroms.

3. The method of claim 1, wherein the doped and the undoped amorphous silicon layers are formed at approximately 500° to 600° C.

4. The method of claim 1, wherein the doped and the undoped amorphous silicon layers are formed by using $Si_2H_6$ gas.

5. The method of claim 1, wherein the doped amorphous silicon layers are formed by performing a chemical vapor deposition process.

6. The method of claim 5, wherein the doped amorphous silicon layers are in-situ doped during the chemical vapor deposition process.

7. The method of claim 1, wherein the doped amorphous silicon layers comprise a dopant of phosphorus.

8. The method of claim 7, wherein the dopant concentration is about $1 \times 10^{19}$ to $1 \times 10^{22}$ atom/cm$^3$.

9. The method of claim 1, further comprising annealing the doped and the undoped amorphous silicon layers.

10. The method of claim 1, wherein one of the undoped amorphous silicon layers is formed on and adjacent to the gate dielectric.

\* \* \* \* \*